(12) United States Patent
Gao

(10) Patent No.: US 11,997,831 B2
(45) Date of Patent: May 28, 2024

(54) CONNECTOR ALIGNMENT DESIGN FOR SERVERS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 141 days.

(21) Appl. No.: 17/557,885

(22) Filed: Dec. 21, 2021

(65) Prior Publication Data

US 2023/0200024 A1    Jun. 22, 2023

(51) Int. Cl.
    *H05K 7/20* (2006.01)
    *F28F 9/04* (2006.01)

(52) U.S. Cl.
    CPC ........... *H05K 7/20772* (2013.01); *F28F 9/04* (2013.01); *H05K 7/20781* (2013.01); *F28F 2280/00* (2013.01)

(58) Field of Classification Search
    None
    See application file for complete search history.

(56) References Cited

U.S. PATENT DOCUMENTS

| | | | |
|---|---|---|---|
| 9,351,428 B2* | 5/2016 | Eckberg | F16L 37/34 |
| 10,405,458 B2* | 9/2019 | Fukunaga | H05K 7/20272 |
| 10,863,652 B1* | 12/2020 | Conroy | H05K 7/20763 |
| 10,912,230 B1* | 2/2021 | Gao | H05K 7/18 |
| 10,921,070 B2* | 2/2021 | Chen | H05K 7/20781 |
| 11,147,192 B2* | 10/2021 | Gao | G06F 1/183 |
| 11,439,035 B2* | 9/2022 | Thibaut | H05K 7/1452 |
| 2016/0165761 A1* | 6/2016 | Cox | H05K 7/20272 211/26.2 |
| 2017/0127575 A1* | 5/2017 | Lunsman | H05K 7/20263 |
| 2019/0269039 A1* | 8/2019 | Harvilchuck | F28F 3/12 |
| 2021/0307208 A1* | 9/2021 | Shao | H05K 7/20781 |
| 2021/0348706 A1* | 11/2021 | Yang | F16L 37/00 |
| 2021/0385978 A1* | 12/2021 | Shao | H05K 7/1489 |

* cited by examiner

*Primary Examiner* — Courtney L Smith
(74) *Attorney, Agent, or Firm* — WOMBLE BOND DICKINSON (US) LLP

(57) ABSTRACT

A connector assembly may include a plate to be attached to a server chassis of an electronic rack; a connection module; and a moveable alignment module having a guiding structure and configured to be coupled to the plate via the connection module. The moveable alignment module may house one or more fluid blind mate connectors that fluidly connect to one or more cold plates that are thermally coupled to one or more electronic server components of the server chassis. The connection module may enable the moveable alignment module to be moveable when the guiding structure engages a distribution manifold of the electronic rack to align and couple the one or more fluid blind mate connectors to either at least one of a supply line connector or a return line connector of the distribution manifold, thereby enabling fluid communication between the server chassis and the distribution manifold.

18 Claims, 7 Drawing Sheets

CONNECTOR ALIGNMENT DESIGN FOR SERVERS

FIELD

Embodiments of the present disclosure relate generally to electronics cooling for servers in a server rack. In particular, a connector assembly can have a moveable alignment module that facilitates to engage a blind mate fluid connector to different sections of a thermal loop, such as, server cooling components and rack cooling components.

BACKGROUND

Information Technology (IT) includes technology such as computers that are accessible through the internet or a local network, which provide storage of, or access to, data, websites, computer programs, algorithms, services, and more. IT equipment such as servers and other electronic components (e.g., peripheral devices) can be installed in a server chassis. These server chassis can then be installed in a server rack, which may also be referred to as an IT rack.

A server rack can be populated with a plurality of server chassis, each server chassis housing one or more printed circuit boards where the electronics components and integrated circuits are packaged. The server chassis can serve to manage power, thermal requirements, electronic connectivity, structural support, and other considerations of the IT equipment.

Liquid cooling for high power density electronics has increased in popularity because air cooling can be thermally insufficient in some circumstances. Liquid cooling allows for higher packaging density and increased computing load of electronics, by properly transferring the heat load generated by the electronics and at the same time, providing proper thermal environment.

A server rack may include a plurality of server chassis installed upon it. Some server chassis may have high-density components—multiple servers may be populated to and coexist in a single server chassis. Other server racks may have a single server. As such, the number and/or position of connectors from one server chassis to another in a server rack may vary based on the type or number of servers that are housed by the server chassis.

A server rack may include infrastructure (e.g., rack cooling component) to distribute and manage fluid (e.g., a liquid coolant) to and from each of the server chassis that are populated within the server rack. This infrastructure may form a fluid recirculation loop for the server chassis and the server rack. However, the conventional infrastructure lacks flexibility to accommodate the various configurations of the server chassis and the server rack.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Figure 1:
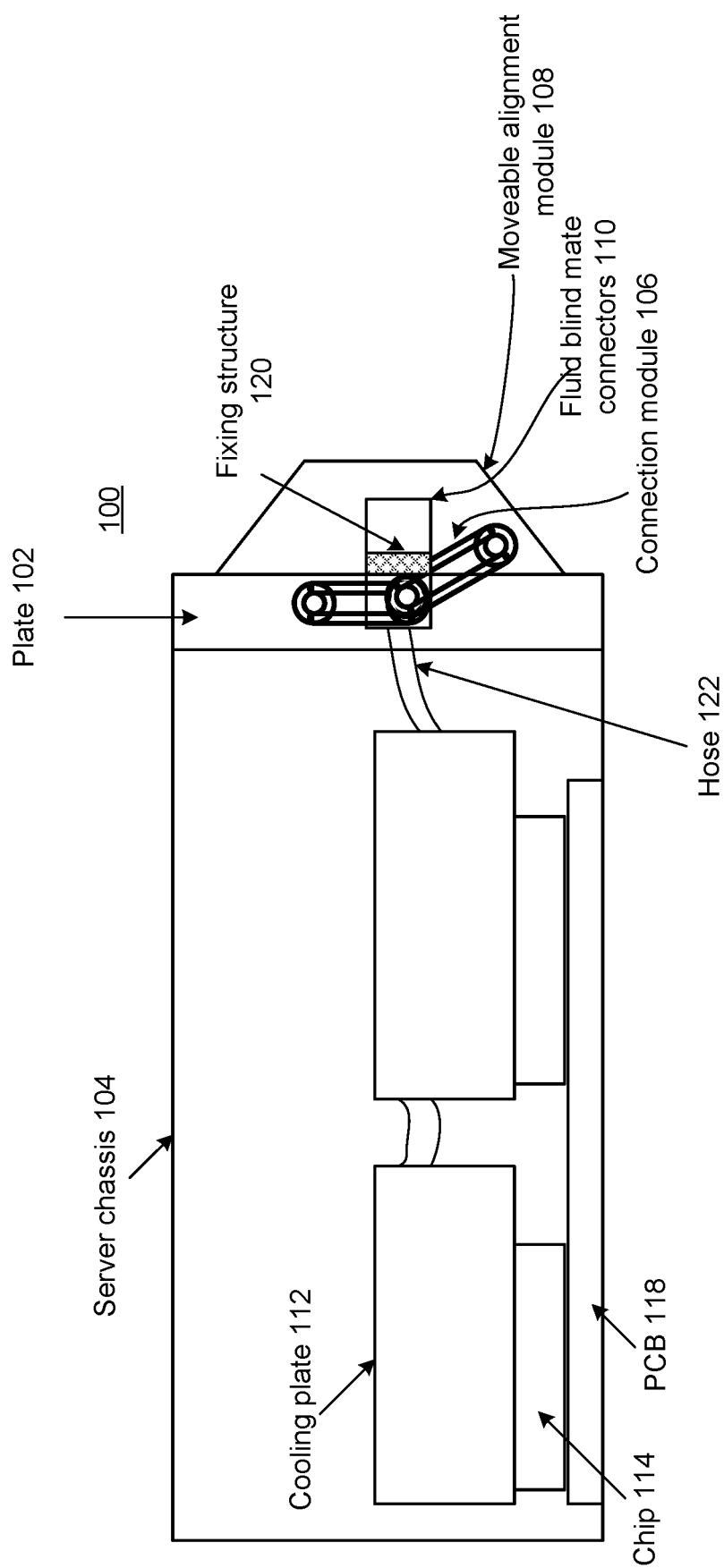
FIG. 1 shows a side view of a connector assembly installed on a server chassis, according to some embodiments.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

A liquid cooling system may require using blind mate fluid connectors to engage different sections of a thermal loop, such as server chassis cooling components and electronic rack cooling components. Designing the liquid cooling system is challenging because a successful engagement of the blind mate fluid connectors requires highly accurate co-design of the server chassis and the electronic rack. Moreover, the existing solutions may not be economical and may only be operable for dedicated servers. Embodiments of the present disclosure provide a solution that can be used to connect a liquid cooling server chassis and an electronic rack. Specifically, the solution solves a challenge of designing and implementing blind mating connections for liquid cooling server chassis and the electronic rack by providing a highly reliable automatic connection for blind mate fluid connectors between the server chassis and the electronic rack. In this manner, design efficiency for both the server chassis and the electronic rack can be enhanced.

Embodiments of the present disclosure can address issues identified, such as providing highly accurate design for both the rack side and the server side; reducing complexity and difficulty of system and component design; accommodating various configurations of a server chassis; accommodating various cooling technologies; providing highly reliable design; enabling an ease of implementation; providing full protection of the connectors; and providing highly reliable rack level design and implementation.

Embodiments of the present disclosure provide a solution that allows the electronic rack to be designed in different configurations, such as for different liquid cooling technologies and different redundant designs. The solution can also be integrated to different types of servers with minor modifications. The solution can additionally be modified for different types of cooling modules using blind mating connectors.

According to one aspect, a connector assembly may include a plate to be attached to a server chassis of an electronic rack; a connection module; and a moveable alignment module having a guiding structure and configured to be coupled to the plate via the connection module. The moveable alignment module may house one or more fluid blind mate connectors that fluidly connect to one or more cold plates that are thermally coupled to one or more server components of the server chassis. The connection module may enable the moveable alignment module to be moveable when the guiding structure engages with a distribution manifold of the electronic rack to align and couple the one or more fluid blind mate connectors to at least one of a supply line connector or a return line connector of the distribution manifold, thereby forming a fluid connection between the server chassis and the distribution manifold.

In an embodiment, the connection module includes a first joint fixedly coupled to the plate, a second joint coupled to the first joint via a first guiding channel, and a third joint fixedly coupled to the moveable alignment module, wherein the third joint is coupled to the second joint via a second guiding channel. The second joint is capable of swinging with respect to the first joint via the first guiding channel, and wherein the third joint is capable of swinging with respect to the second joint via the second guiding channel, such that the moveable alignment module is enabled to move in a plurality of directions.

In one embodiment, distribution manifold comprises a frame including a plurality of openings corresponding to the plurality of server chassis of the electronic rack, each of the plurality of openings having a supply line connector or a return line connector configured to distribute a cooling liquid to a corresponding server chassis.

When the first server chassis is moved towards to a first opening of the plurality of openings, the moveable alignment module contacts the first opening that causes the moveable alignment module to move with respect to the plate to align at least one of the one or more fluid blind mate connectors with at least one of the supply line connector or the return line connector. When an exterior surface of the moveable alignment module contacts an edge of the first opening, the edge of the first opening forces the moveable alignment module to move due to a shape of the exterior surface. The moveable alignment module is in a cone shape.

In one embodiment, each of the openings has a diameter that covers at least one of the supply line connector or return line connector. In one embodiment, each of the openings has a center that is aligned with a center of the supply line connector or the return line connector. In one embodiment, each of the openings has a varying diameter to accommodate a varying guiding structure. In one embodiment, a front portion of the frame is removable.

In one embodiment, the connector assembly may also include a leak detection arrangement having a leak detector disposed at a connection surface between the moveable alignment module and the plate.

According to another aspect, a server chassis includes a container to contain one or more server components (e.g., processors) and a connector assembly as described above coupled to the container. According to a further aspect, an electronic rack includes a plurality of server chassis, each server chassis including a connector module as described above.

FIG. 1 shows a side view of an example of a connector assembly 100 that can be attached to a server chassis, according to some embodiments. Note that while FIG. 1 represents a side view of the connector assembly 100, FIG. 1 shows a rear view of the connection module 106 (including the three joints and two guiding channels (e.g., beam structure)). This aims to provide a better display of the key unit and the design.

Referring to FIG. 1, the connector assembly 100 may include a plate 102 to be attached to a server chassis 104 of an electronic rack (not shown) such as a container of the sever chassis, a connection module 106; and a moveable alignment module 108 having a guiding structure and configured to be coupled to the plate 102 via the connection module 106. The moveable alignment module 108 may house one or more fluid blind mate connectors 110 that can fluidly connect to one or more cold plates 112 that are thermally coupled to one or more server components 114 of the server chassis. A server component can include a processor and/or a memory of a computer server. The connection module 106 may enable the moveable alignment module 108 to be moveable when the guiding structure engages with a distribution manifold of the electronic rack to align and couple the one or more fluid blind mate connectors 110 to at least one of a supply line connector or a return line connector of the distribution manifold, thereby forming a fluid connection between the server chassis 104 and the distribution manifold. The connection module 106 may be configured to connect the plate 102 and the moveable alignment module 108. As shown the moveable alignment module 108 fully contains the fluid blind mate connector 110 that is configured in a fixed position with respect to the movable alignment module.

In one embodiment, the one or more fluid blind mate connectors 110 may be fixed on a fixing structure 120. The fixing structure may be attached to the moveable alignment module 108 for fixing the one or more fluid blind mate connectors 110. That is, the fluid blind mate connector 110 does not move relative to moveable alignment module 108. However, due to the connection module 106, the fluid blind mate connector 110 and the movable alignment module 108 can move together relative to plate 102 mounted on the container of the server chassis for the purpose of aligning the fluid blind mate connector 110 with a connector of a rack fluid distribution manifold, which will be described in details further below.

The connector assembly 100 may be configured to connect the server chassis 104 and the distribution manifold of the electronic rack for cooling an electronic server component 114 positioned on a circuit board such as a printed circuit board (PCB) 118. The one or more cold plates 112 are thermally coupled to one or more electronic server components 114 such as, for example, an integrated circuit (IC) which can be a surface mounted device (SMD) that is fixed to a printed circuit board (PCB) 118. A flexible hose 122 may be configured to connect the one or more cold plates 112 to the one or more fluid blind mate connectors 110.

Figure 2:
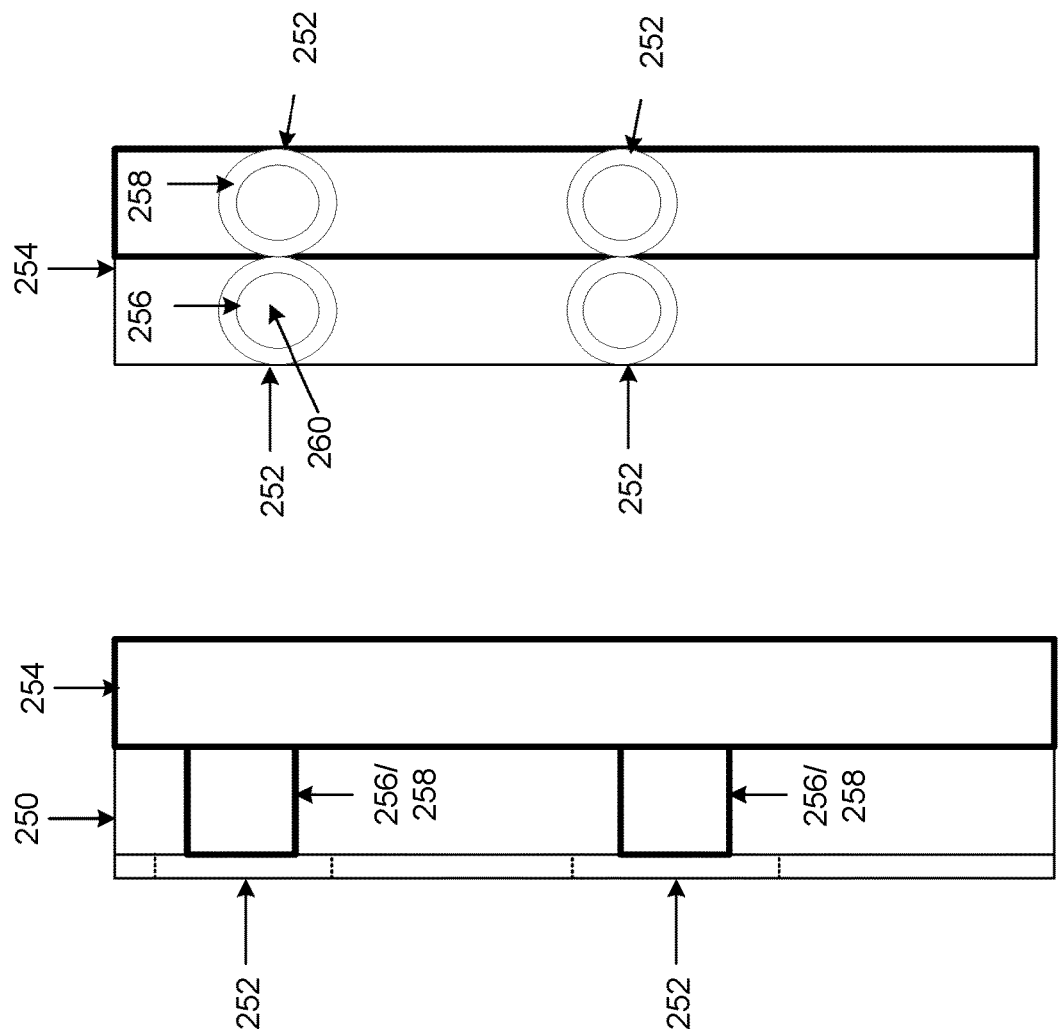
FIGS. 2A and 2B show a side and a front view of a frame of a distribution manifold, respectively, according to some embodiments.

FIGS. 2A and 2B show a side and a front view of a frame of a distribution manifold 254, respectively, according to some embodiments. Distribution manifold 254 may be mounted on a rear end of an electronic rack and coupled to an external cooling loop or an external cooling source. Distribution manifold 254 is configured to receive cooling liquid from an external cooling loop or source and distribute the cooling liquid to the server chassis of the electronic rack.

Referring to FIG. 2A, a distribution manifold 254 may be connected to a server chassis 104 (see FIG. 1) for distributing cooling liquid to cool an electronic server component of the server chassis 104 (see FIG. 1) by the use of the above described connector assembly 100 (see FIG. 1). The distribution manifold 254 may include a supply and return lines. The distribution manifold 254 may include the frame 250 with openings 252. Each opening corresponds to a server chassis. Each of the openings 252 may have a supply line connector 256 or a return line connector 258. In one embodiment, the supply line connector 256 or a return line connector 258 may be a blind mate fluid connector. The frame 250 may be equipped with the distribution manifold 254 and may be configured to distribute a cooling liquid to the server chassis.

The distribution manifold 254 may be equipped with the supply line connector 256 or return line connector 258. As shown, each of the openings 252 may allow other associated components to be connected to the supply line connector 256 or return line connector 258 on the distribution manifold. While the frame 250 provides a protection to the supply line connector 256 or return line connector 258, each of the openings 252 may expose the supply line connector 256 or return line connector 258 to an environment outside of the frame 250. In addition, each of the openings 252 may also function as a guiding structure when receiving a counterpart of the supply line connector 256 or return line connector 258 during mating. The frame 250 may fully contain the supply line connector 256 or return line connector 258 but not each of the openings 252.

Referring to FIG. 2B, in one embodiment, each of the openings 252 has a diameter that covers each of the supply 256 and return line connectors 258. Each of the openings 252 may be configured as a guiding channel to guide the fluid blind mate connector 110 to be aligned with a center of each of the openings 252 during a mating process. Mating process may refer to the process of connecting the blind mate fluid connector 110 (see FIG. 1) and the supply 256 or return line connector 258 on the distribution manifold 254 to fluidly distribute the cooling fluid to the one or more cold plates 112 (see FIG. 1). In this manner, the fluid blind mate connector 110 and the supply line connector 256 or return line connector 258 can be aligned and connected by use of the connector assembly. The fluid blind mate connector 110 and the supply 256 or return line connector 258 are fully contained and covered in both server and rack side, for reliability consideration. Each of the openings 252 may allow the engagement of the fluid blind mate connector 110 and the supply 256 or return line connector 258.

In one embodiment, each of the openings 252 has a center 256 that may be aligned with a center of the supply line connector or the return line connector. In one embodiment, each of the openings 252 may have a varying diameter to accommodate a varying guiding structure of the moveable alignment module 108. In this manner, the varying diameter of each of the openings 252 may match the varying diameter of the guiding structure. Alternatively, the diameter of each of the openings 252 may be fixed.

In one embodiment, the frame 250 may enclose the supply line connector 256 or the return line connector 258. The frame 250 may be configured to ensure the supply line connector 256 or the return line connector 258 are well protected and that they remain functional and in great shape.

In one embodiment, a front portion of the frame 250 may be removable. In an alternative embodiment, the front portion of the frame 250 may not be removable and may be permanently affixed to the frame 250. The front portion of the frame 250 may contain and cover the supply 256 or return line connector 258. Similarly, the fluid blind mate connector 110 is fully contained by the moveable alignment unit 108 (see FIG. 1). Each of the openings 252 may allow the engagement of the fluid blind mate connector 110 and the supply 256 or return line connector 258. By using each of the openings 252, the guiding panel and auto-engagement mechanism may be implemented.

Figure 3:
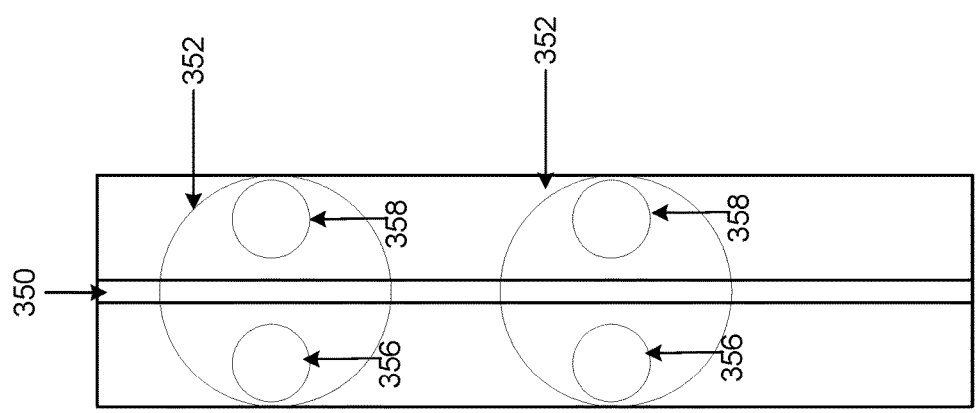
FIG. 3 shows a front view of another example of a frame of a distribution manifold, according to some embodiments.

FIG. 3 shows a front view of another example of a frame 350, according to some embodiments. Referring to FIG. 3, in one embodiment, each of the openings 352 has a diameter that covers both supply 356 and return 358 line connectors. As shown, each of the openings 352 may be configured to circumvent both supply 356 and return 358 line connectors. On the server side, the moveable alignment module would include a pair of blind mate connectors corresponding to be aligned with the supply and return line connectors. Note that in order to align the server blind mate connectors (also simply referred to as server connectors) with the supply and return line connectors (also simply referred to as manifold connectors), according to one embodiment, a cross section shape of the moveable alignment module may have to match a shape of a corresponding opening. In this example, the moveable alignment module is in a cone shape and its cross section shape is in a circle, while a counterpart opening is also in a circle shape. However, other shapes may also be applicable.

Figure 4:
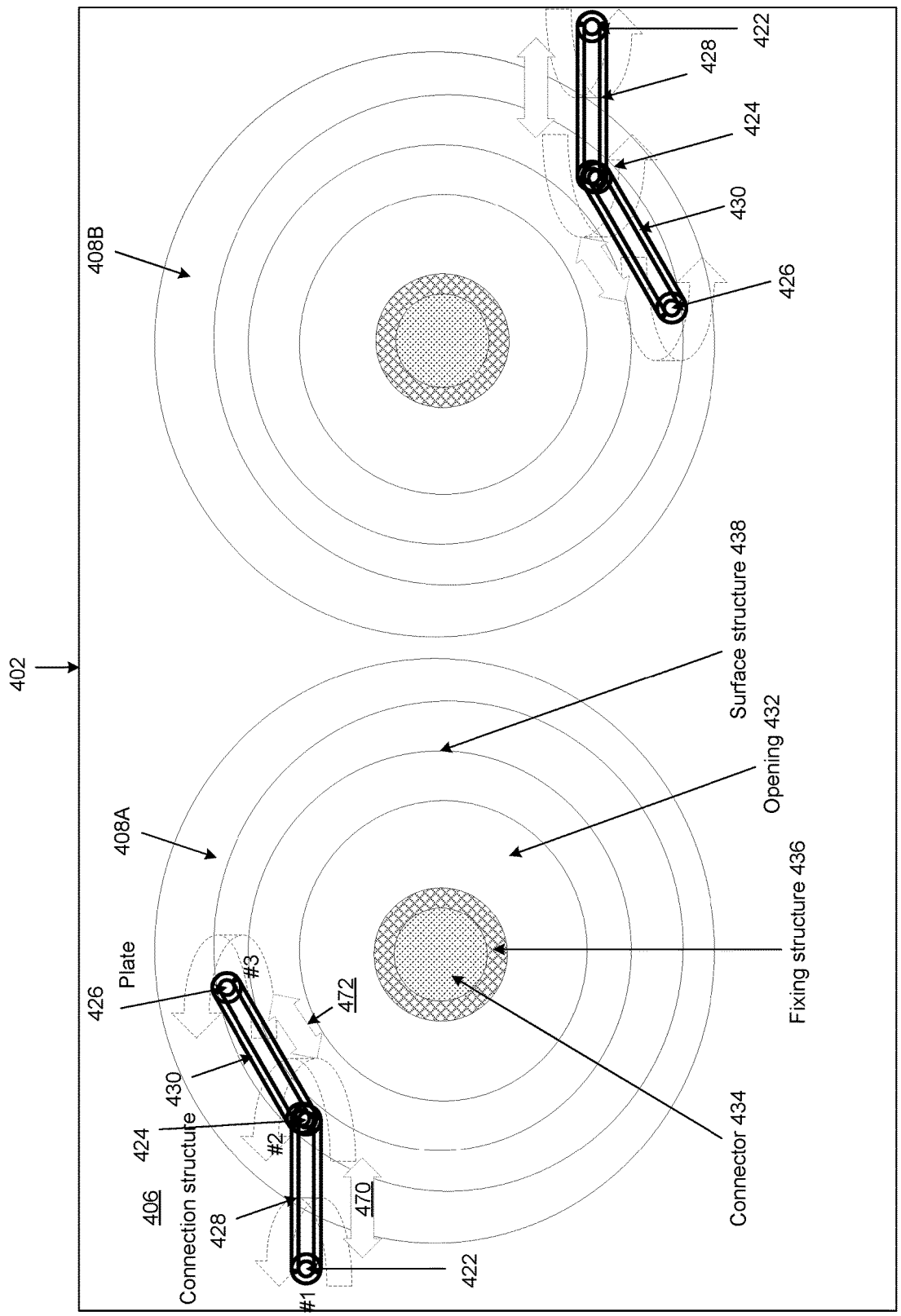
FIG. 4 shows an example of a moveable alignment module, according to some embodiments.

FIG. 4 shows an example of a moveable alignment module and a connection module, according to some embodiments. Referring to FIG. 4, in one embodiment, the connection module 406 may include a first joint 422 fixedly coupled to the plate 402, a second joint 424, and a third joint 426 coupled to the moveable alignment module such as moveable alignment modules 408A and 408B. The first joint 422 and the second joint 424 may be connected by a first guiding channel 428. The second joint 424 and the third joint 426 may be connected by a second guiding channel 430. The first and the second guiding channels 428 and 430 may enable the connection module 406 and the moveable alignment module 408A or 408B to move freely along horizontal and vertical directions. The first and the second guiding channels 428 and 430 may enable the second joint 424 to slide along the first and the second guiding channels 428 and 430.

The connection module 406 may enable the moveable alignment module 408A, 408B to move around in various directions in the plane. In this example, first joint 422 is fixedly attached to plate 402, while third joint 426 is fixedly attached to moveable alignment module 408A. Second joint 424 is coupled to first joint 422 via guiding channel 428 and coupled to third joint 426 via guiding channel 430. That is, second joint 424 is not fixedly attached to plate 402 or a moveable alignment module such as moveable alignment module 408A or 408B. Second joint 424 can move around (e.g., swinging or rotating) with respect to first joint 422 via guiding channel 428. Similarly, third joint 426 can move around with respect to second joint 424 via guiding channel 430. Second joint 424 can move with respect to first joint 422, while third joint 426 (together with the moveable alignment module attached thereon) can move around second joint 424 concurrently.

For example, the connection module 406 may enable the moveable alignment module 408A to move along a horizontal direction 470 (indicated by a dotted arrow). Similarly, the connection module 406 may enable the moveable alignment module 408A to move along a diagonal direction 472 (indicated by a dotted arrow). The connection module 406 may enable the moveable alignment module 408A to rotate or swing around the first joint 422, the second joint 424, and the third joint 426 (indicated by a dotted arrow). In this manner, the moveable alignment module 408A may move in various directions during the mating process.

Still referring to FIG. 4, the moveable alignment modules 408A and 408B may be used to connect a server chassis to both supply and return lines. As shown, the moveable alignment module 408A may be used with a connector to connect to a supply line while the moveable alignment module 408B may be used with a connector to connect to a return line. The moveable alignment modules 408A, for example, may include an opening 432 in its center configured to receive an electronic rack connector, such that the electronic rack connector will be connected to the blind mate fluid connector 434. The blind mate fluid connector 434 may be fixed on a fixing structure 436. The moveable alignment module 408A may also include a surface structure 438 to ensure a proper contact between the surface structure 438 and an opening on a rack frame.

When the server chassis is being populated to the electronic rack, the alignment module 408A may make contact with an edge of an opening on the rack frame first. Then, the contact of the alignment module 408A and the opening edge on the rack frame may generate a counterforce onto the surface structure 438. Note that the opening on the rack frame is fixed. As a result, the connection module 406 may allow the surface structure 438 to slightly move with respect to the plate 402. In this manner, the blind mate fluid connector 434 may be guided to any location on the plate 402 by the opening on the rack frame.

When the alignment module 408A is fully aligned with the opening on the frame, the fluid blind mate connector and the supply line or the return line connector are aligned and connected. The alignment module 408A and the opening on the frame enable a proper mating between the fluid blind mate connector and the supply line or the return line connector. In this manner, design efficiency can be enhanced to accommodate various server chassis and electronic racks, cooling modules, rack fluid manifold, and connectors.

Figure 5:
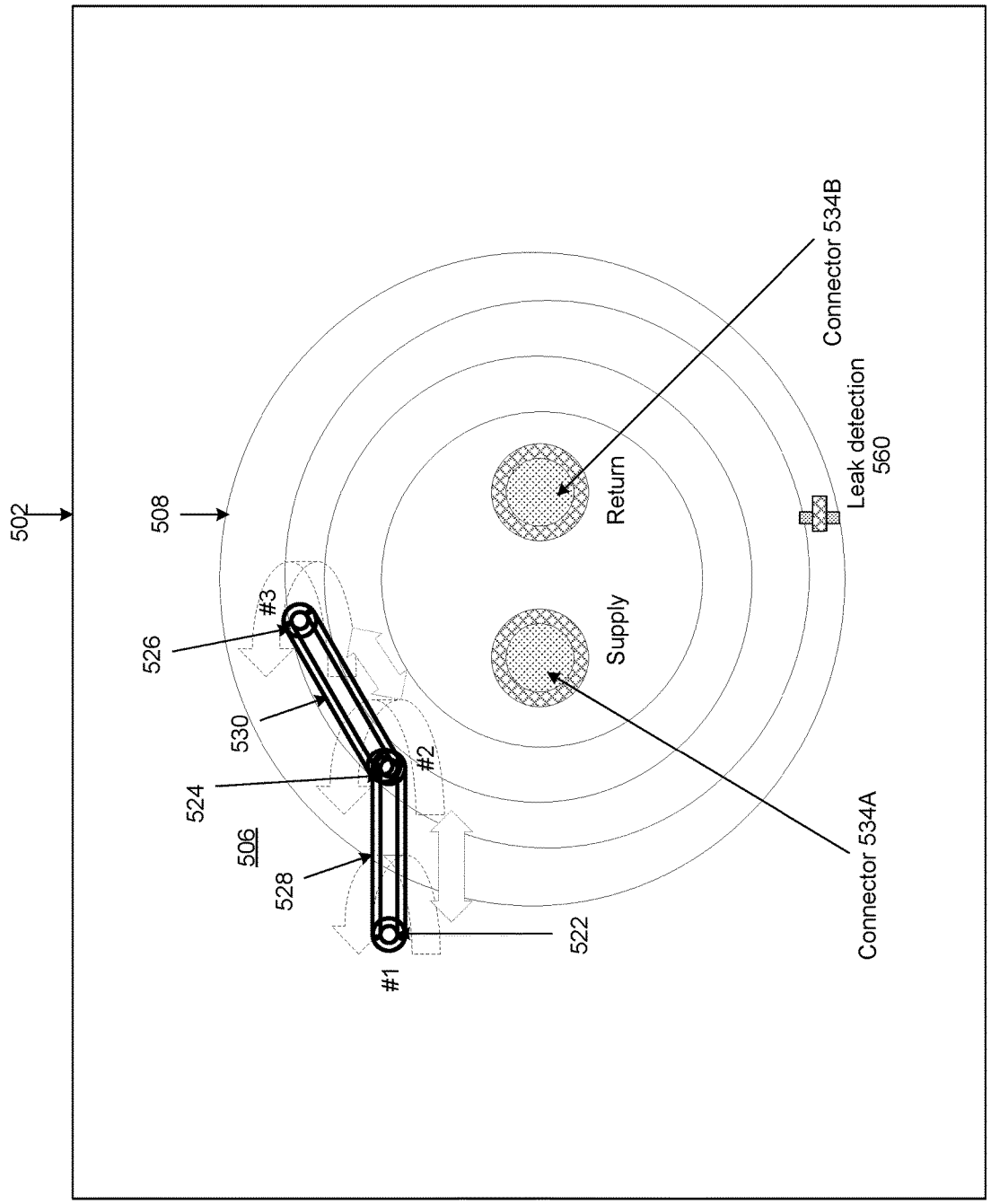
FIG. 5 shows another example of a moveable alignment module, according to some embodiments.

FIG. 5 shows another example of a moveable alignment module, according to some embodiments. Referring to FIG. 5, the moveable alignment module 508 may be configured for a full loop connection. As shown, the moveable alignment module 508 may be configured with a connector to connect to a supply line 534A and a connector to connect to a return line 534B. As described above, the connection module 506 may include a first joint 522 fixedly coupled to the plate 502, a second joint 524, and a third joint 526 coupled to the moveable alignment module 508. The first 522 and the second 524 joints may be connected by a first guiding channel 528. The second 524 and the third 526 joints may be connected by a second guiding channel 530. The first 528 and the second 530 guiding channels may enable the connection module 506 to move freely along various directions.

Still referring to FIG. 5, the connector assembly may further include a leak detection arrangement including a leak detector 560 (sensor or apparatus) disposed proximate at a connection surface between the moveable alignment module 508 and the plate 502. This is the place most susceptible to developing leaks, so placing the leak detector in this position would be most advantageous. The leak detector 560 (sensor or apparatus) may be coupled to this location and configured to sense cooling fluid leakage into the location where the cooling fluid is supplied to the server chassis.

Figure 6:
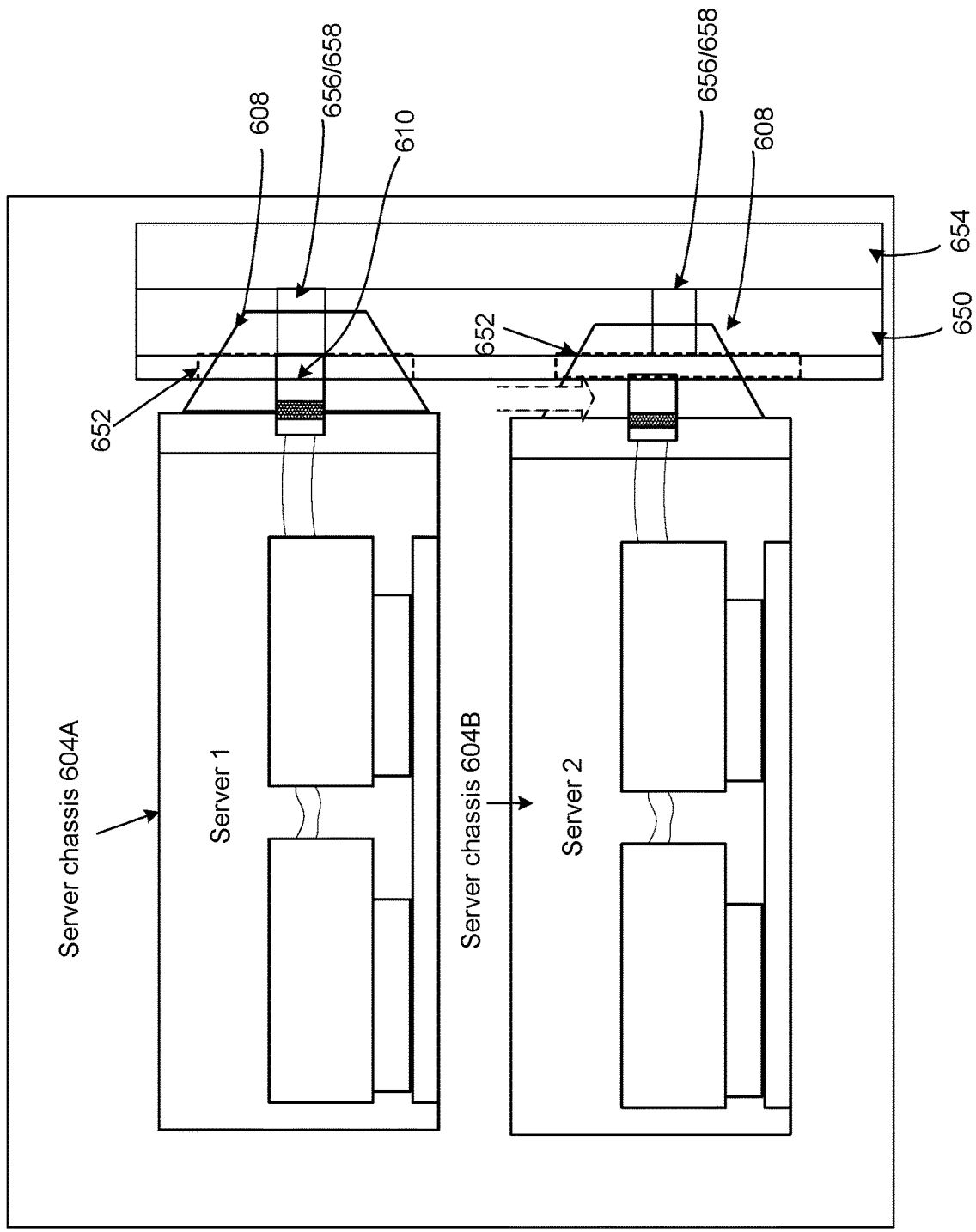
FIG. 6 shows a side view of an example of a server rack that includes a plurality of server chassis and a plurality of connector assemblies, according to some embodiments.

FIG. 6 shows a side view of an example of a server rack that includes a plurality of server chassis and a plurality of connector assemblies, according to some embodiments. Note that the detailed structure of the above-described connection structure and the moveable alignment module are not shown in this figure. Referring to FIG. 6, the distribution manifold 654 may include the frame 650 including openings 652. Each of the openings 652 may cover a supply line connector 656 or a return line connector 658. In one embodiment, the supply line connector 656 or a return line connector 658 may be a blind mate fluid connector. The frame 650 may be configured to distribute a cooling liquid to the server chassis. The distribution manifold 654 may be equipped with the supply line connector 656 or return line connector 658. As shown, server chassis 1 604A is fully populated and the fluid blind mate connector 610 and the supply line connector 656 may be engaged. Similarly, when the server chassis 1 604A is fully populated, the fluid blind mate connector 610 and the return line connector 656 may be engaged. As shown, the moveable alignment module 608 and the opening 652 are fully aligned and the blind mate fluid connector 610 is fully aligned with the supply 656 or return line connector 658.

Still referring to FIG. 6, server chassis 2 604B is in the process of being populated to the final location. In its current position, the alignment module 608 is not fully aligned with the opening 652 (shown in dashed line rectangle) on the frame. Similarly, the blind mate fluid connector 610 is not fully aligned and disconnected with the supply line connector 656 or the return line connector 658. The opening 652 guides the alignment module 608 slightly until the alignment module 608 and the opening 652 are fully aligned. In this example, the connection module may enable the alignment module 608 (together with the blind mate connector) to move downwardly (shown by the dashed downward arrow) when the exterior surface of the alignment module contacts an edge of the opening, until the alignment module 608 is fully aligned with the opening 652. In this manner, the blind mate fluid connector on the cooling module of the server chassis may be ensured to be at the accurate blind mating location.

In this example, when server chassis 604B is moved towards the rack manifold of the electronic rack, the exterior surface of alignment module 608 contacts with an edge (in this example, an upper edge) of opening 652. When server chassis 604B continues moving towards the rack manifold, the edge of opening 652 forces alignment module 608 downwardly, which in turn align the server blind mate connector with rack connector of the rack manifold.

Figure 7:
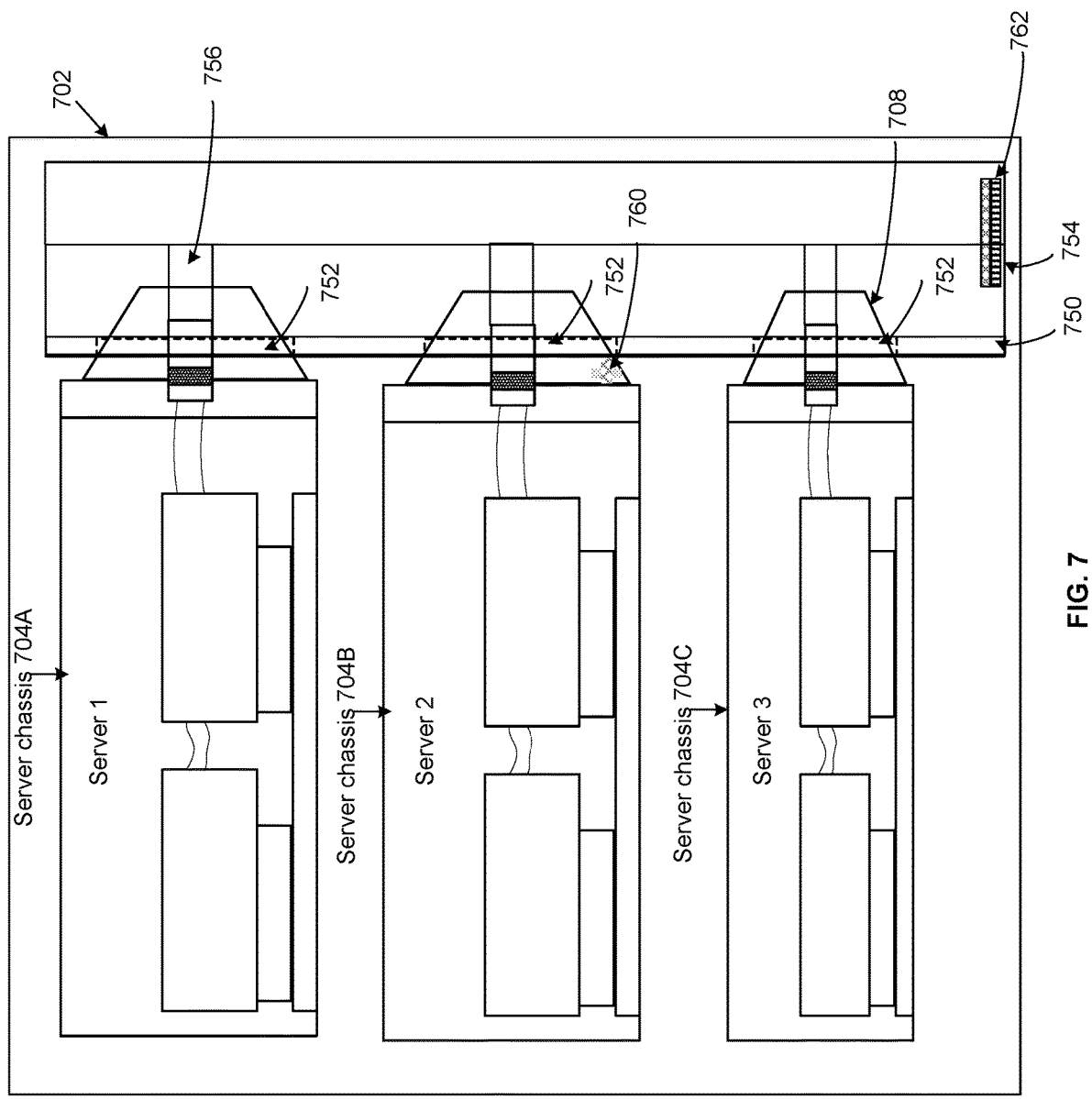
FIG. 7 shows a side view of another example of a server rack that includes a plurality of server chassis, plurality connector assemblies, and leak detection arrangement, according to some embodiments.

FIG. 7 shows an example of a server rack that includes a plurality of server chassis, plurality connector assemblies, and leak detection arrangement, according to some embodiments. Referring to FIG. 7, server 3 704C may be a different type of server chassis compared to server 1 704A or server 2 704B. Server 3 704C may be integrated with a different alignment module 708 and a different frame. Note that the detailed structure of the above-described connection structure and the moveable alignment module are not shown in this figure. Referring to FIG. 7, the distribution manifold 754 may include the frame 750 including openings 752. Each of the openings 752 may have a supply line connector 756 or a return line connector 758. The frame 750 may be configured to distribute a cooling liquid to the server chassis. The distribution manifold 754 may be equipped with the supply line connector 756 or return line connector 758. As shown, server chassis 1 704A is fully populated and the fluid blind mate connector 710 and the supply line connector 756 may be engaged. Similarly, when the server chassis 2 704B is fully populated, the fluid blind mate connector 710 and the return line connector 756 may be engaged. As shown, the moveable alignment module 708 and the opening 752 are fully aligned and the blind mate fluid connector 710 of the server 3 704C is fully aligned with the supply 756 or return line connector 758.

As shown, the connector assembly may further include a leak detection arrangement including a leak detector 760 (sensor or apparatus) disposed proximate at a connection surface between the moveable alignment module 708 and the plate 702. This is the place most susceptible to developing leaks, so placing the leak detector in this position would be most advantageous. The leak detector 760 (sensor or apparatus) may be coupled to this location and configured to sense cooling fluid leakage into the location where the cooling fluid is supplied to the server chassis. In addition, the leak detection arrangement integrated to the alignment unit and the manifold frame can enhance the solution reliability and improve the design efficiency.

In another embodiment, as illustrated in FIG. 7, the connector assembly may further include a leak detection arrangement including a leak detector 762 (sensor or apparatus) disposed proximate a bottom section of the distribution manifold 754. The leak detector 762 (sensor or apparatus) may be coupled to this location and configured to sense cooling fluid leakage into the location where the cooling fluid is supplied to the server chassis. In one example, the leak detector 762 may be positioned at the bottom section of the distribution manifold 754.

The present disclosure is also directed to an electronic rack, including a number of server chassis, and a connector assembly as described above, attached to each of the number of server chassis. The present disclosure is also directed to a server cooling system including a number of electronic racks. Each of the number of electronic racks may include a server chassis and a connector assembly as described above, attached to each of the number of server chassis.

Furthermore, although not shown, a server rack can, in some embodiments, include various other supporting components. For example, a server rack can include a cooling distribution unit (CDU), a rack management unit (RMU). The server chassis can also be referred to as a server blade that can be inserted into an array of server slots respectively from frontend or backend of the server rack. A server rack can be either open to the environment or partially contained by a rack container. The server rack can include one or more cooling fans that can generate airflow from a frontend to a backend of the server rack. In some embodiments, a server rack may include a cooling fan for each server chassis. The cooling fans may be mounted on each server chassis to generate airflow through the server chassis. In some embodiments, the CDU can include a heat exchanger, liquid pump, a pump controller, a fluid reservoir, a power supply, sensors and more. The CDU's heat exchanger may be a liquid-to-liquid heat exchanger that includes a first loop with inlet and outlet ports having a first pair of liquid connectors coupled to external liquid supply/return lines to form a primary loop. The liquid supply/return lines may be fluidly connected to a set of room manifolds, which may be coupled to an external heat removal system, or external cooling loop. In addition, the heat exchanger may further include a second loop with two ports having a second pair of liquid connectors coupled to the fluid manifold to form a secondary loop that fluidly supplies and returns fluid between one or more server chassis and the CDU.

Each of the server chassis may house one or more servers which may include one or more components such as, for example, central processing units or CPUs, graphical processing units (GPUs), memory, and/or storage devices. Each component may perform data processing tasks, where the component may include software installed in a storage device, loaded into the memory, and executed by one or more processors to perform the data processing tasks. At least some of these components may be attached to the bottom of any of the cold plates as described above. A server may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

A server rack may further include an optional RMU configured to provide and manage power supplied to servers, fan modules, and the CDU. The RMU may be coupled to a power supply unit to manage the power consumption of the power supply unit. The power supply unit may include the necessary circuitry (e.g., an alternating current (AC) to direct current (DC) or DC to DC power converter, backup battery, transformer, or regulator, etc.,) to provide power to the rest of the components of the server rack.

Aspects of the cooling distribution system can be flexible and deployable in different system architectures; for example, the system can be deployed with a localized pumping system (e.g., a closed system architecture) or central pumping system (e.g., an open system architecture). Aspects described can simultaneously separate IT equipment from leaked fluid and direct leaked fluid to pool in a common location for detection, thereby minimizing the impact of a fluid leak and increasing overall system reliability.

Some embodiments may include a non-transitory machine-readable medium (such as microelectronic memory) having stored thereon instructions, which program one or more data processing components (generically referred to here as a "processor") to perform operations described herein. In some embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive to the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A connector assembly, comprising:
    a plate configured to be attached to a server chassis;
    an alignment module movably coupled to the plate by a connection module that is coupled to both the plate and the alignment module, wherein:
        the alignment module houses one or more fluid blind mate connectors adapted to be connected to one or more cold plates in the server chassis,
        the alignment module is movable relative to the plate, and
        the alignment module includes a guiding structure adapted to engage with a distribution manifold, wherein when the guiding structure engages with the distribution manifold, it aligns and couples the one or more fluid blind mate connectors with at least one of a supply line connector or a return line connector of the distribution manifold to form a fluid connection between the server chassis and the distribution manifold; and
    wherein the distribution manifold comprises a frame including an opening corresponding to the server chassis, the opening having the supply line connector or the return line connector configured to distribute a cooling liquid to the server chassis.

2. The connector assembly of claim 1, wherein the connection module comprises:
    a first joint fixedly coupled to the plate;
    a second joint coupled to the first joint via a first guiding channel; and
    a third joint fixedly coupled to the moveable alignment module, wherein the third joint is coupled to the second joint via a second guiding channel.

3. The connector assembly of claim 2, wherein the second joint is capable of swinging with respect to the first joint via the first guiding channel, and wherein the third joint is capable of swinging with respect to the second joint via the second guiding channel, such that the moveable alignment module is enabled to move in a plurality of directions.

4. The connector assembly of claim 1, wherein when the server chassis is moved towards to a first opening of a plurality of openings, the moveable alignment module contacts the first opening that causes the moveable alignment module to move with respect to the plate to align at least one of the one or more fluid blind mate connectors with at least one of the supply line connector or the return line connector.

5. The connector assembly of claim 4, wherein when an exterior surface of the moveable alignment module contacts an edge of the first opening, the edge of the first opening forces the moveable alignment module to move due to a shape of the exterior surface.

6. The connector assembly of claim 5, wherein the moveable alignment module is in a cone shape.

7. The connector assembly of claim 4, wherein each of the plurality of openings has a diameter that covers at least one of the supply line connector or the return line connector.

8. The connector assembly of claim 4, wherein each of the plurality of openings has a center that is aligned with a center of the supply line connector or the return line connector.

9. The connector assembly of claim 4, wherein each of the plurality of openings has a varying diameter to accommodate a varying guiding structure.

10. The connector assembly of claim 1, wherein the frame encloses the supply line connector or the return line connector.

11. The connector assembly of claim 1, wherein a front portion of the frame is removable.

12. The connector assembly of claim 1, further comprising a leak detection arrangement including a leak detector disposed at a connection surface between the moveable alignment module and the plate.

13. A server chassis of an electronic rack, comprising:
    a container to house one or more server chassis, each server chassis including therein components attached to one or more cold plates; and
    a connector assembly coupled to the container, the connector assembly including
        a plate mounted on the container;
    an alignment module movably coupled to the plate by a connection module that is coupled to both the plate and the alignment module, wherein:
        the alignment module houses one or more fluid blind mate connectors adapted to be connected to one or more cold plates in the server chassis,
        the alignment module is movable relative to the plate, and
        the alignment module includes a guiding structure adapted to engage with a distribution manifold, wherein when the guiding structure engages with the distribution manifold, it aligns and couples the one or more fluid blind mate connectors with at least one of a supply line connector or a return line connector of the distribution manifold to form a fluid connection between the server chassis and the distribution manifold;
    wherein the distribution manifold comprises a frame including an opening corresponding to each server chassis, each opening having the supply line connector or the return line connector configured to distribute a cooling liquid to the corresponding server chassis.

14. The server chassis of claim 13, wherein the connection module comprises:
    a first joint fixedly coupled to the plate;
    a second joint coupled to the first joint via a first guiding channel; and
    a third joint fixedly coupled to the moveable alignment module, wherein the third joint is coupled to the second joint via a second guiding channel.

15. The server chassis of claim 14, wherein the second joint is capable of swinging with respect to the first joint via the first guiding channel, and wherein the third joint is capable of swinging with respect to the second joint via the second guiding channel, such that the moveable alignment module is enabled to move in a plurality of directions.

16. The server chassis of claim 13, wherein when the server chassis is moved towards to a first opening of a plurality of openings, the moveable alignment module contacts the first opening that causes the moveable alignment module to move with respect to the plate to align at least one of the one or more fluid blind mate connectors with at least one of the supply line connector or the return line connector.

17. The server chassis of claim 16, wherein when an exterior surface of the moveable alignment module contacts an edge of the first opening, the edge of the first opening forces the moveable alignment module to move due to a shape of the exterior surface.

18. An electronic rack, comprising:
a distribution manifold; and
a plurality of server chassis, each server chassis including
a container to house one or more server components attached to one or more cold plates, and
a connector assembly coupled to the container, including
a plate mounted on the container,
an alignment module movably coupled to the plate by a connection module that is coupled to both the plate and the alignment module, wherein:
the alignment module houses one or more fluid blind mate connectors adapted to be connected to one or more cold plates in the server chassis,
the alignment module is movable relative to the plate, and
the alignment module includes a guiding structure adapted to engage with the distribution manifold,
wherein when the guiding structure engages with the distribution manifold, it aligns and couples the one or more fluid blind mate connectors with at least one of a supply line connector or a return line connector of the distribution manifold to form a fluid connection between the server chassis and the distribution manifold; and
wherein the distribution manifold comprises a frame including an opening corresponding to each server chassis, each opening having the supply line connector or the return line connector configured to distribute a cooling liquid to the corresponding server chassis.

* * * * *